United States Patent
Kim

(10) Patent No.: US 11,239,219 B2
(45) Date of Patent: Feb. 1, 2022

(54) PASSIVE DEVICE MODULE AND SEMICONDUCTOR PACKAGE INCLUDING THE SAME

(71) Applicant: SAMSUNG ELECTRONICS CO., LTD., Suwon-si (KR)

(72) Inventor: Sanguk Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 37 days.

(21) Appl. No.: 16/816,555

(22) Filed: Mar. 12, 2020

(65) Prior Publication Data
US 2021/0082890 A1    Mar. 18, 2021

(30) Foreign Application Priority Data
Sep. 17, 2019  (KR) .......................... 10-2019-0114067

(51) Int. Cl.
| | |
|---|---|
| H01L 25/16 | (2006.01) |
| H01L 23/31 | (2006.01) |
| H01L 23/538 | (2006.01) |
| H01L 23/64 | (2006.01) |

(52) U.S. Cl.
CPC .......... *H01L 25/16* (2013.01); *H01L 23/3128* (2013.01); *H01L 23/5383* (2013.01); *H01L 23/5384* (2013.01); *H01L 23/5389* (2013.01); *H01L 23/642* (2013.01); *H01L 23/645* (2013.01)

(58) Field of Classification Search
CPC . H01L 25/16; H01L 23/3128; H01L 23/5383; H01L 23/5384; H01L 23/5389; H01L 23/642; H01L 23/645
See application file for complete search history.

(56) References Cited

U.S. PATENT DOCUMENTS

| | | | |
|---|---|---|---|
| 10,115,671 B2 | 10/2018 | Shenoy et al. | |
| 10,157,852 B2 | 12/2018 | Yu et al. | |
| 2014/0264733 A1 | 9/2014 | Yuan et al. | |
| 2017/0250159 A1 | 8/2017 | Lee | |
| 2018/0005916 A1* | 1/2018 | Chen | ............... H01L 25/0655 |
| 2018/0286834 A1* | 10/2018 | Hua | ............... H01L 21/76874 |
| 2019/0013301 A1 | 1/2019 | Cheah et al. | |
| 2019/0123029 A1 | 4/2019 | Hsiao et al. | |
| 2020/0098621 A1* | 3/2020 | Bharath | ............ H01L 25/0655 |

FOREIGN PATENT DOCUMENTS

WO    WO 2018/063196 A1    4/2018

\* cited by examiner

*Primary Examiner* — Fernando L Toledo
*Assistant Examiner* — Neil R Prasad
(74) *Attorney, Agent, or Firm* — Lee IP Law, P.C.

(57) ABSTRACT

A semiconductor package including a lower redistribution layer including wiring patterns; a lower substrate on the lower redistribution layer, the lower substrate including a cavity; an application processor on the lower redistribution layer in the cavity; a cache memory chip on the application processor; a passive device module on the application processor; a plurality of first through-silicon vias penetrating the application processor to connect the lower redistribution layer to the passive device module; and lower bumps on a bottom surface of the lower redistribution layer, wherein the passive device module is adjacent to a side of the cache memory chip.

17 Claims, 14 Drawing Sheets

PASSIVE DEVICE MODULE AND SEMICONDUCTOR PACKAGE INCLUDING THE SAME

CROSS-REFERENCE TO RELATED APPLICATION

Korean Patent Application No. 10-2019-0114067, filed on Sep. 17, 2019, in the Korean Intellectual Property Office, and entitled: "Passive Device Module and Semiconductor Package Including the Same," is incorporated by reference herein in its entirety.

BACKGROUND

1. Field

Embodiments relate to a passive device module and a semiconductor package including the passive device module.

2. Description of the Related Art

A fan-out panel level packaging (FO-PLP)-type semiconductor package may include passive devices such as coils and capacitors in the vicinity of a bottom lower bumps. For example, the bottom lower bumps may be formed to have a height greater than a thickness of each passive device, thus increasing the thickness of a semiconductor package.

SUMMARY

The embodiments may be realized by providing a semiconductor package including a lower redistribution layer including wiring patterns; a lower substrate on the lower redistribution layer, the lower substrate including a cavity; an application processor on the lower redistribution layer in the cavity; a cache memory chip on the application processor; a passive device module on the application processor; a plurality of first through-silicon vias penetrating the application processor to connect the lower redistribution layer to the passive device module; and lower bumps on a bottom surface of the lower redistribution layer, wherein the passive device module is adjacent to a side of the cache memory chip.

The embodiments may be realized by providing a semiconductor package including a lower redistribution layer including a plurality of wiring patterns; a lower substrate on the lower redistribution layer, the lower substrate including a cavity; an application processor on the lower redistribution layer in the cavity; a cache memory chip on the application processor; a first passive device module on a top surface of the application processor and adjacent to a first edge of the application processor; a plurality of first through-silicon vias penetrating the application processor and electrically connecting the application processor to the first passive device module; a plurality of second through-silicon vias penetrating the application processor and electrically connecting the application processor to the cache memory chip; and lower bumps on a bottom surface of the lower redistribution layer, wherein the first passive device module is adjacent to a first side of the cache memory chip.

The embodiments may be realized by providing a semiconductor package including a lower package; an upper package stacked on the lower package; and a plurality of upper bumps configured to connect the lower package to the upper package, wherein the lower package includes a lower redistribution layer including a plurality of wiring patterns; a lower substrate including a cavity; an application processor on the lower redistribution layer in the cavity; a cache memory chip on the application processor; a passive device module in a first region of a top surface of the application processor; and lower bumps on a bottom surface of the lower redistribution layer, and wherein the passive device module is adjacent and parallel to at least one side surface of the cache memory chip.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
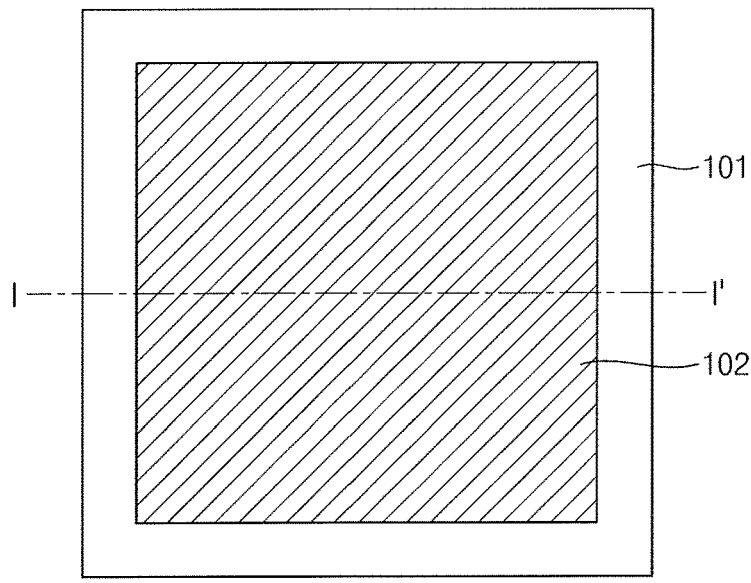
FIG. 1A illustrates a plan view of a semiconductor package according to an embodiment of the present disclosure.
Figure 1B:
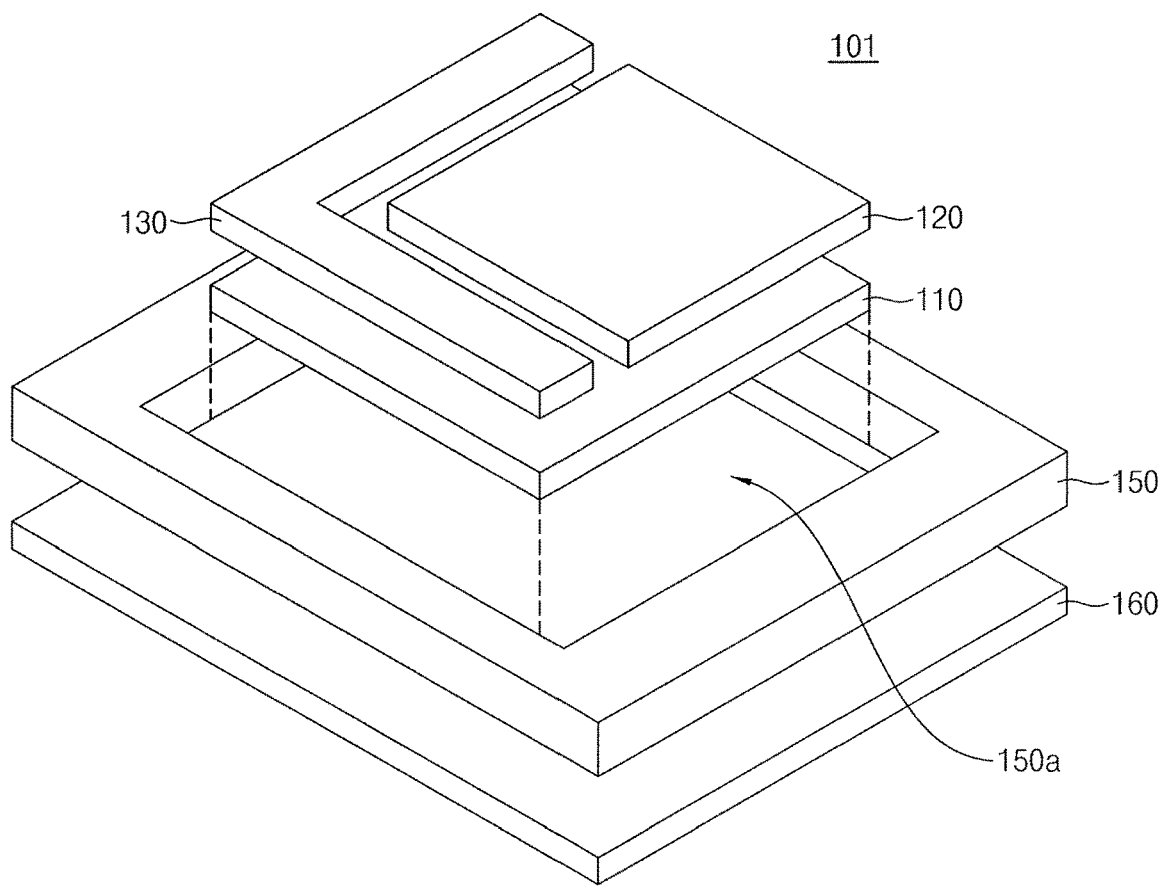
FIG. 1B illustrates a perspective view of a configuration in which an application processor, a cache memory chip, and a passive device module are in a cavity in a lower substrate.
Figure 2A:
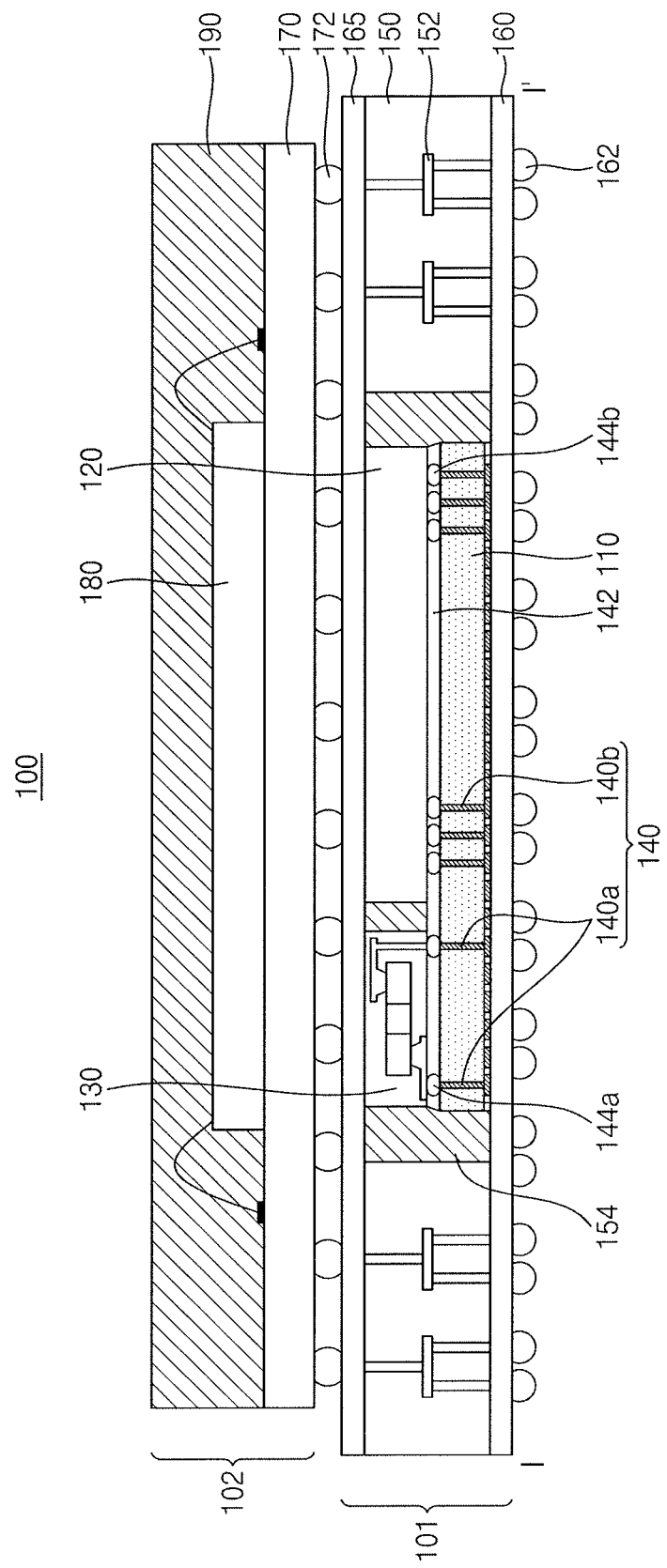
FIG. 2A illustrates a cross-sectional view of the semiconductor package taken along line I-I' of FIG. 1A.

FIG. 1A illustrates a plan view of a semiconductor package 100 according to an embodiment of the present disclosure. FIG. 1B illustrates a perspective view of a configuration in which an application processor 110, a cache memory chip 120, and a passive device module 130 are in a cavity 150a in a lower substrate 150. FIG. 2A illustrates a cross-sectional view of the semiconductor package 100 taken along line I-I' of FIG. 1A.

Referring to FIGS. 1A, 1B, and 2A, the semiconductor package 100 according to an embodiment of the present disclosure may be formed in a fan-out panel level packaging (FO-PLP) type. The semiconductor package 100 according to the embodiment of the present disclosure may include a lower package 101 (e.g. a first package) and an upper package 102 (e.g. a second package) stacked on the lower package 101.

The upper package 102 may include an upper substrate 170, a plurality of upper bumps 172, a main memory chip 180, and an upper encapsulation layer 190. The lower package 101 may include an application processor 110, a cache memory chip 120, a passive device module 130, a plurality of through-silicon vias (TSVs) 140, an adhesive layer 142, a plurality of micro-bumps 144a and 144b, a lower substrate 150, a lower encapsulation layer 154, a lower redistribution layer 160, lower bumps 162, and an upper redistribution layer 165.

The main memory chip 180 may be on the upper substrate 170. The upper substrate 170 may include a PCB (printed circuit board). The main memory chip 180 may include, e.g., a DRAM (dynamic random access memory), an ReRAM (resistive random access memory), a PcRAM (phase-changeable random access memory), an MRAM (magneto-resistive random access memory), NVM (non-volatile memory) or a static random access memory (SRAM). As used herein, the term "or" is not an exclusive term, e.g., "A or B" would include A, B, or A and B.

The upper encapsulation layer 190 may cover top surfaces of the main memory chip 180 and the upper substrate 170. In an implementation, the upper encapsulation layer 190 may include an epoxy molding compound (EMC).

The upper bumps 172 may be under the upper substrate 170 (e.g., facing the lower package 101). The upper bumps 172 may be electrically connected to the upper redistribution layer 165. The upper redistribution layer 165 may include an interposer substrate, and may include a plurality of wiring patterns. The upper bumps 172 and via connectors 152 (of the lower substrate 150) may be electrically connected to each other through the wiring patterns in the upper redistribution layer 165.

The upper package 102 and the lower package 101 may be electrically connected to each other through the upper bumps 172, the via connectors 152, and the upper redistribution layer 165. For example, signals and data may be transmitted from the lower package 101 to the upper package 102 or from the upper package 102 to the lower package through the upper bumps 172 and the via connectors 152. For example, signals and data may be transmitted from the application processor 110 to the main memory chip 180 or from the main chip 180 to the application processor 110 through the upper bumps 172 and the via connectors 152.

The lower substrate 150 may be on the lower redistribution layer 160. The lower substrate 150 may include a printed circuit board (PCB). A cavity 150a may be formed inside the lower substrate 150. For example, the lower substrate 150 may have a frame shape (e.g., may have an open central region) in a top view. For example, the cavity 150a may penetrate (e.g., completely penetrate) the lower substrate 150. The application processor 110, the cache memory chip 120, and the passive device module 130 may be in the cavity 150a in the lower substrate 150. For example, the lower substrate 150 may surround sides of the application processor 110, the cache memory chip 120, and the passive device module 130.

The adhesive layer 142 may be between the application processor 110 and the cache memory chip 120. The adhesive layer 142 may be between the application processor 110 and the passive device module 130.

The lower encapsulation layer 154 may be in the cavity 150a. The lower encapsulation layer 154 may surround or cover the application processor 110, the cache memory chip 120, and the passive device module 130. The lower encapsulation layer 154 may be between the cache memory chip 120 and the passive device module 130. The lower encapsulation layer 154 may be between the passive device module 130 and the lower substrate 150. The lower encapsulation layer 154 may be between the application processor 110 and the lower substrate 150. The lower encapsulation layer 154 may be between the cache memory chip 120 and the lower substrate 150. The lower encapsulation layer 154 may surround or cover sides of the passive device module 130, the cache memory chip 120, and the application processor 110. The top surface of the lower encapsulation layer 154 and the top surface of the lower substrate 150 (e.g., surfaces facing away from the lower redistribution layer 160 in a vertical direction) may be coplanar. The top surface of the lower encapsulation layer 154 and the top surface of the cache memory chip 120 may be coplanar. For example, the lower encapsulation layer 154 may include an epoxy molding compound (EMC).

A plurality of via connectors 152 may be formed in the lower substrate 150. Top portions of the via connectors 152 may be electrically connected to the upper bumps 172, and bottom portions of the via connectors 152 may be electrically connected to the lower bumps 162. Signals and data may be transmitted from the upper package 102 to the lower redistribution layer 160 through the via connectors 152. The lower substrate 150 may be formed in a single-layered structure or in a multi-layered structure.

Figure 2B:
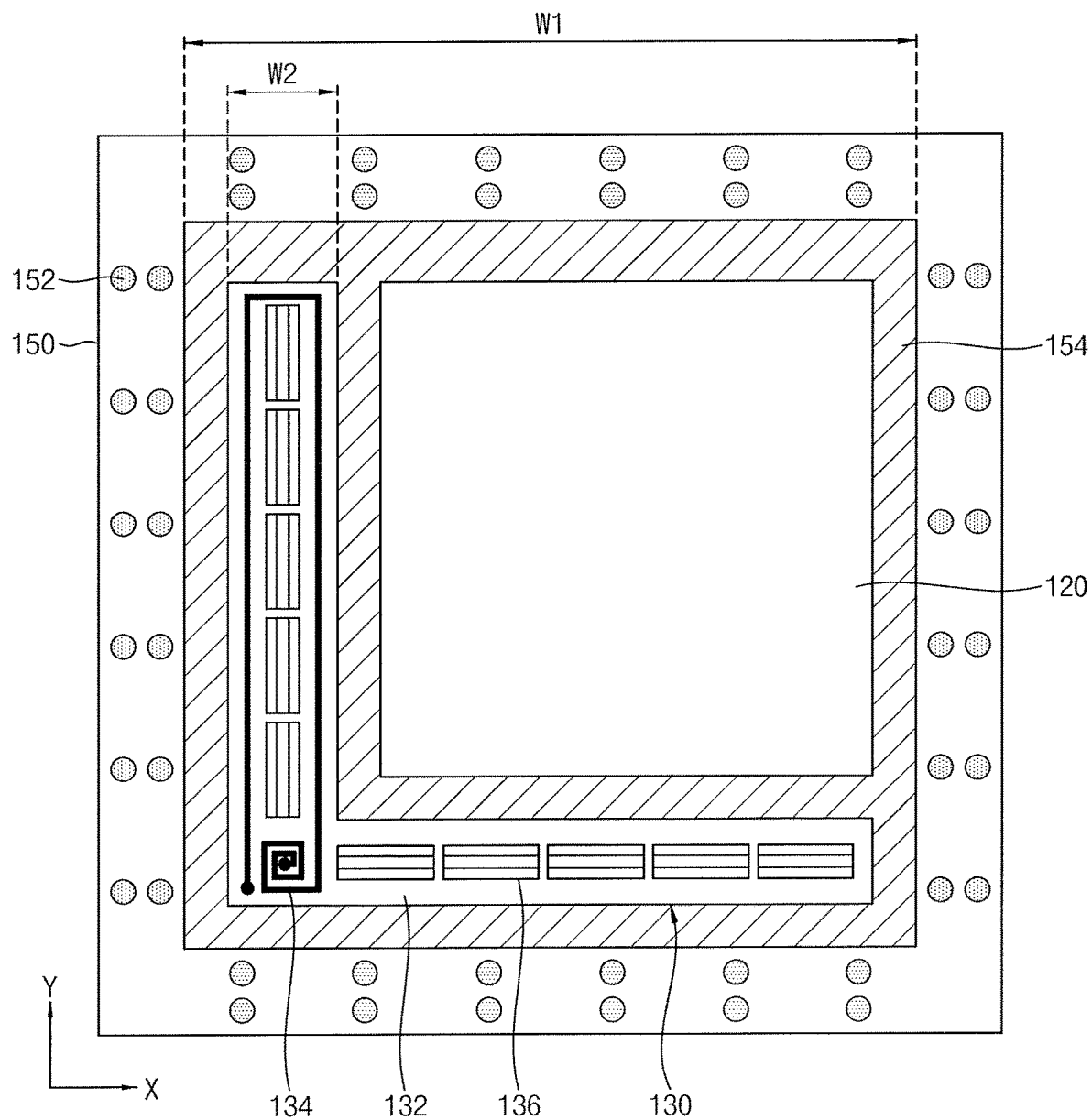
FIG. 2B illustrates a top view of the application processor, the cache memory chip, and the passive device module.

FIG. 2B illustrates a top view of the application processor 110, the cache memory chip 120, and the passive device module 130.

Referring to FIGS. 1B, 2A, and 2B, the application processor 110 may be on a central portion of the lower redistribution layer 160. The cache memory chip 120 and the passive device module 130 may be on the top surface of the application processor 110 (e.g., a surface of the application processor 110 that faces away from the lower redistribution layer 160). In an implementation, the cache memory chip 120 may be in or on a first region of the top surface of the application processor 110. The passive device module 130 may be in or on a second region of the top surface of the application processor 110. The passive device module 130 may be in the vicinity of (e.g., adjacent to) the cache memory chip 120 on the application processor 110. In an implementation, the cache memory chip 120 and the passive device module 130 may be disposed side-by-side to be adjacent to each other in a horizontal direction (X-direction or Y-direction) on the application processor 110. The application processor 110, the cache memory chip 120, and the passive device module 130 may be in the cavity 150a in the lower substrate 150.

The passive device module 130 may be adjacent to at least one of four edges of the application processor 110. In an implementation, the passive device module 130 may be adjacent to (e.g., may extend lengthwise along) two of the four edges of the application processor 110 (e.g., the passive device module 130 may have a L shaped structure in which edges thereof extend lengthwise in the X-direction and the Y-direction adjacent to two edges of the application processor 110). The passive device module 130 may be in the vicinity of the cache memory chip 120.

The top surface of the passive device module 130 and the top surface of the cache memory chip 120 may be at a same level (e.g., may be a same distance from the lower redistribution layer 160 in the vertical direction). In an implementation, the top surface of the passive device module 130 and the top surface of the cache memory chip 120 may be at different levels. In an implementation, the top surface of the passive device module 130 may be at a higher level than (e.g., farther from the lower redistribution layer 160 in the vertical direction than) the top surface of the cache memory chip 120. In an implementation, the top surface of the cache memory chip 120 may be at a higher level than the top surface of the passive device module 130.

The lower redistribution layer 160 may include a printed circuit board (PCB) or a silicon layer. The lower redistribution layer 160 may include a plurality of wiring patterns, a plurality of via connectors, and an insulating layer (e.g. a silicon oxide film, a silicon nitride film, or a silicon oxynitride film). The wiring patterns formed in the lower redistribution layer 160 and the through-silicon vias 140 may be electrically connected to each other. The application processor 110, the cache memory chip 120, and the passive device module 130 may be connected to one another through the wiring patterns in the lower redistribution layer 160 and the through-silicon vias 140.

The through-silicon vias 140 may include, e.g., aluminum (Al), gold (Au), silver(Ag), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

The through-silicon vias 140 may penetrate the application processor 110. Among the through-silicon vias 140, first through-silicon vias 140a may penetrate the application processor 110 to electrically connect the lower redistribution layer 160 to the passive device module 130. The application processor 110 and the lower redistribution layer 160 may be electrically connected to each other, and the lower redistribution layer 160 and the passive device module 130 may be electrically connected to each other through the first through-silicon vias 140a. For example, the application processor 110 and the passive device module 130 may be electrically connected to each other.

Among the through-silicon vias 140, second through-silicon vias 140b may penetrate the application processor 110 to electrically connect the lower redistribution layer 160 to the cache memory chip 120. The application processor 110 and the lower redistribution layer 160 may be electrically connected to each other, and the lower redistribution layer 160 and the cache memory chip 120 may be electrically connected to each other through the second through-silicon vias 140b. For example, the cache memory chip 120 and the application processor 110 may be electrically connected to each other.

The passive device module 130 may include a module substrate 132, at least one inductor 134, and a plurality of capacitors 136. The module substrate 132 of the passive device module 130 may be formed in a single-layered structure or in a multi-layered structure.

The module substrate 132 of the passive device module 130 may be adjacent to (e.g., may extend lengthwise along) two of the four edges of the top surface of the application processor 110. In an implementation, the module substrate 132 may be adjacent to the left edge and the lower edge of the top surface of the application processor 110 (e.g., as oriented in FIG. 2B). In a top view, the passive device module 130 may be have an elbow or L shape.

The plurality of capacitors 136 of the passive device module 130 may be disposed side-by-side in the X-direction and the Y-direction (e.g., may be spaced apart from one another in the X-direction and the Y-direction along the edges of the L-shaped passive device module 130. The capacitors 136 may be adjacent to each other. In an implementation, the capacitors 136 may be disposed or arranged parallel to each other. The capacitors 136 may be adjacent to the side of the cache memory chip 120 in a top view.

The inductor 134 of the passive device module 130 may include a conductive wiring, and may have a predetermined length on the top surface of the module substrate 132. The inductor 134 may surround sides of the capacitors 136. In an implementation, in a top view, the inductor 134 may surround the capacitors 136 disposed parallel or adjacent to each other in the X-direction. In an implementation, in the top view, the inductor 134 may surround the capacitors 136 disposed in the X-direction and the Y-direction. In an implementation, the inductor 134 may be at an intersection of lines passing through first capacitors 136 arranged in the X-direction and second capacitors 136 arranged in the Y-direction. The inductor 134 and the capacitors 136 may be disposed side-by-side. In an effort to help prevent undesirably electrical contacting the inductor 134 with other components, an insulating layer may be on the inductor 134.

The position of the inductor 134 may be set in consideration of the contact distance between cores of the application processor 110 and the inductor 134. The cores of the application processor 110 and the inductor 134 may be electrically connected to each other through the wiring patterns of the lower redistribution layer 160, which are in contact with the cores of the application processor 110, and the first through-silicon vias 140a, which are in contact with the wiring patterns of the lower redistribution layer 160 and the inductor 134. The position of the inductor 134 on the module substrate 132 may be set such that the contact distance between the cores of the application processor 110 and the inductor 134 is minimized.

At a position corresponding to at least one of the four corners of the application processor 110, the inductor 134 and the first micro-bumps 144a may be in contact with each other, and the first micro-bumps 144a and the first through-silicon vias 140a may be in contact with each other. The first through-silicon vias 140a and the wiring patterns of the lower redistribution layer 160 may be in contact with each other. The cache memory chip 120 and the second micro-bumps 144b may be in contact with each other, and the second micro-bumps 144b and the second through-silicon vias 140b may be in contact with each other. The second through-silicon vias 140b and the wiring patterns of the lower redistribution layer 160 may be in contact with each other.

The contact position between the inductor 134 and the first through-silicon vias 140a may correspond to the lower-left corner of the application processor 110 (as oriented in FIG. 2B). In an implementation, the contact position between the inductor 134 and the first through-silicon vias 140a may be adjacent to one of the upper-left corner, the upper-right corner, or the lower-right corner of the application processor 110.

In an implementation, as illustrated in FIG. 2B, the inductor 134 may extend lengthwise in the Y-direction. In an implementation, the inductor 134 may extend lengthwise in the X-direction. In an implementation, the inductor 134 may extend in both the X-direction and the Y-direction. In this manner, the length and position of the inductor 134 may be variously adjusted within the passive device module 130. In addition, the positions of the capacitors 136 may be also adjusted within the passive device module 130.

The capacitors 136 may be formed uniformly on the entire surface of the module substrate 132. The capacitors 136 may include low inductance chip capacitors (LICCs) and/or multilayer ceramic capacitors (MLCCs).

Figure 3:
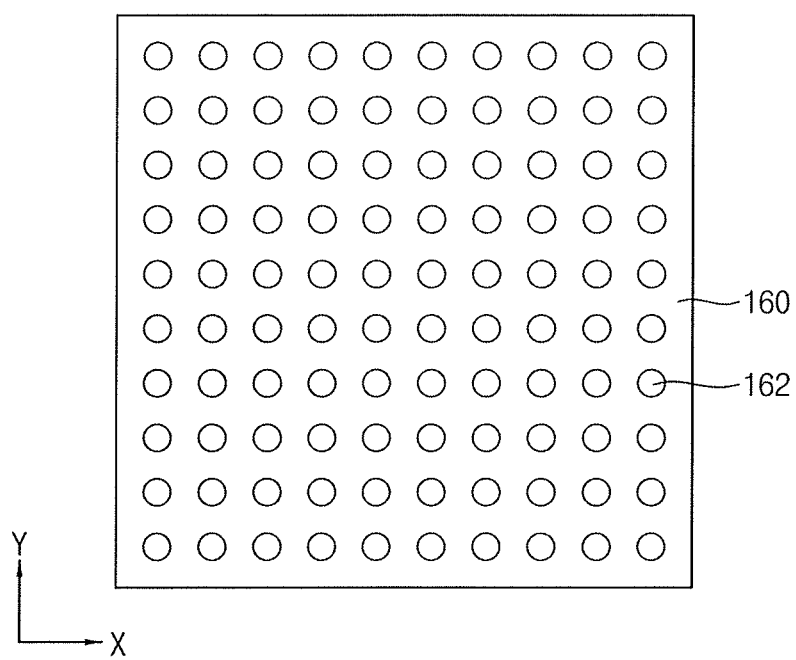
FIG. 3 illustrates a view of the lower bumps shown in FIG. 1.

FIG. 3 illustrates a view of the lower bumps 162 shown in FIG. 1.

Referring to FIGS. 2A and 3, the lower bumps 162 may be under the lower redistribution layer 160 (e.g., opposite to the lower substrate 150). The lower bumps 162 may be uniformly arranged on the entire bottom surface of the lower redistribution layer 160.

The lower bumps 162 may be formed through a reflow process using a highly conductive material, e.g., aluminum or copper. In an implementation, the lower bump 162 may include a solder material. The passive device module 130 and the lower bumps 162 may overlap or be aligned with each other in the vertical direction.

In some other semiconductor packages, passive devices may be under a lower redistribution layer, and it may be impossible to provide lower bumps in the area occupied by the passive devices. The semiconductor package 100 according to an embodiment of the present disclosure may be configured such that the passive device module 130, which includes the inductor 134 and the capacitors 136, is on the application processor 110 (e.g., opposite to the lower redistribution layer 160), and the lower bumps 162 may be on the entire bottom surface of the lower redistribution layer (RDL) 160.

In the semiconductor package 100 according to an embodiment of the present disclosure, the passive device module 130, which includes the at least one inductor 134 and the capacitors 136, may be embedded in the package, and the overall thickness of the semiconductor package 100 may be reduced.

In the semiconductor device package 100 according to an embodiment of the present disclosure, the passive device module 130 and the application processor 110, which may be embedded in the package, may be connected to each other through the first through-silicon vias 140a and the lower redistribution layer 160, and the electrical characteristics of the product may be improved.

In the semiconductor package 100 according to an embodiment of the present disclosure, the at least one inductor 134 and the capacitors 136 may be embedded in the passive device module 130, and the capacity of the inductor 134 and the number of capacitors 136 may be secured.

In the semiconductor package 100 according to an embodiment of the present disclosure, the passive device module 130, which includes the at least one inductor 134 and the capacitors 136, may be embedded in the package, and a sufficient number of in/out terminals may be secured.

Figure 4:
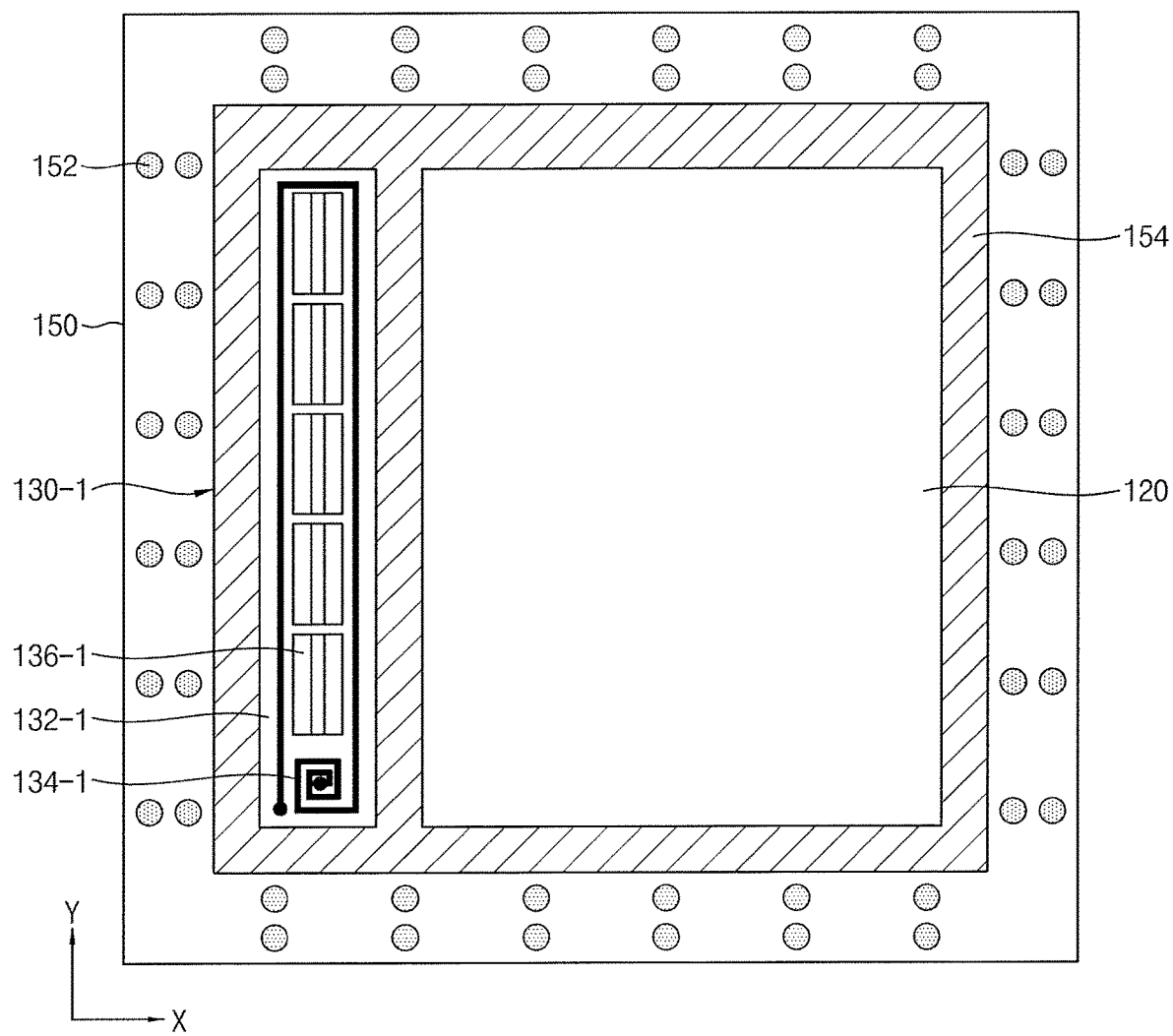
FIG. 4 illustrates an exemplary top view of the application processor, the cache memory chip, and a passive device module.

FIG. 4 illustrates an exemplary top view of the application processor 110, the cache memory chip 120, and a passive device module 130-1.

Referring to FIGS. 2A and 4, the cache memory chip 120 and the passive device module 130-1 may be on the application processor 110. The cache memory chip 120 and the passive device module 130-1 may be adjacent to each other in the horizontal direction (X-direction) on the top surface of the application processor 110.

The passive device module 130-1 may be on at least a portion of the top surface of the application processor 110. The passive device module 130-1 may be in the vicinity of the cache memory chip 120. In an implementation, the passive device module 130-1 may be adjacent to a first side (e.g., only one side) of the cache memory chip 120.

The passive device module 130-1 may include a module substrate 132-1, at least one inductor 134-1, and a plurality of capacitors 136-1. The module substrate 132-1 of the passive device module 130-1 may be adjacent to (e.g., may extend lengthwise along) one (e.g., only one) of the four edges of the top surface of the application processor 110. In an implementation, the module substrate 132-1 may be adjacent to the left edge of the application processor 110 (in the orientation illustrated in FIG. 4). In a top view, the passive device module 130-1 may have a vertical bar shape (e.g., extending lengthwise in the Y-direction).

The capacitors 136-1 of the passive device module 130-1 may be disposed side-by-side in or along the Y-direction. In an implementation, the capacitors 136-1 may be disposed parallel to one side of the cache memory chip 120 in a plan view.

The inductor 134-1 may surround the capacitors 136-1. In a plan view, the inductor 134-1 may surround the capacitors 136-1 disposed side-by-side to each other in the Y-direction. In an implementation, the inductor 134-1 may be disposed side-by-side to sides of the capacitors 136-1 (e.g., may surround outer sides of the group of capacitors 136-1).

At a position adjacent to at least one of the four corners of the application processor 110, the inductor 134-1 and the first through-silicon vias 140a may be in contact with each other. In an implementation, the contact position between the inductor 134-1 and the first through-silicon vias 140a may be adjacent to the lower-left corner of the application processor 110. In an implementation, the contact position between the inductor 134-1 and the first through-silicon vias 140a may be adjacent to the upper-left corner of the application processor 110.

Figure 5:
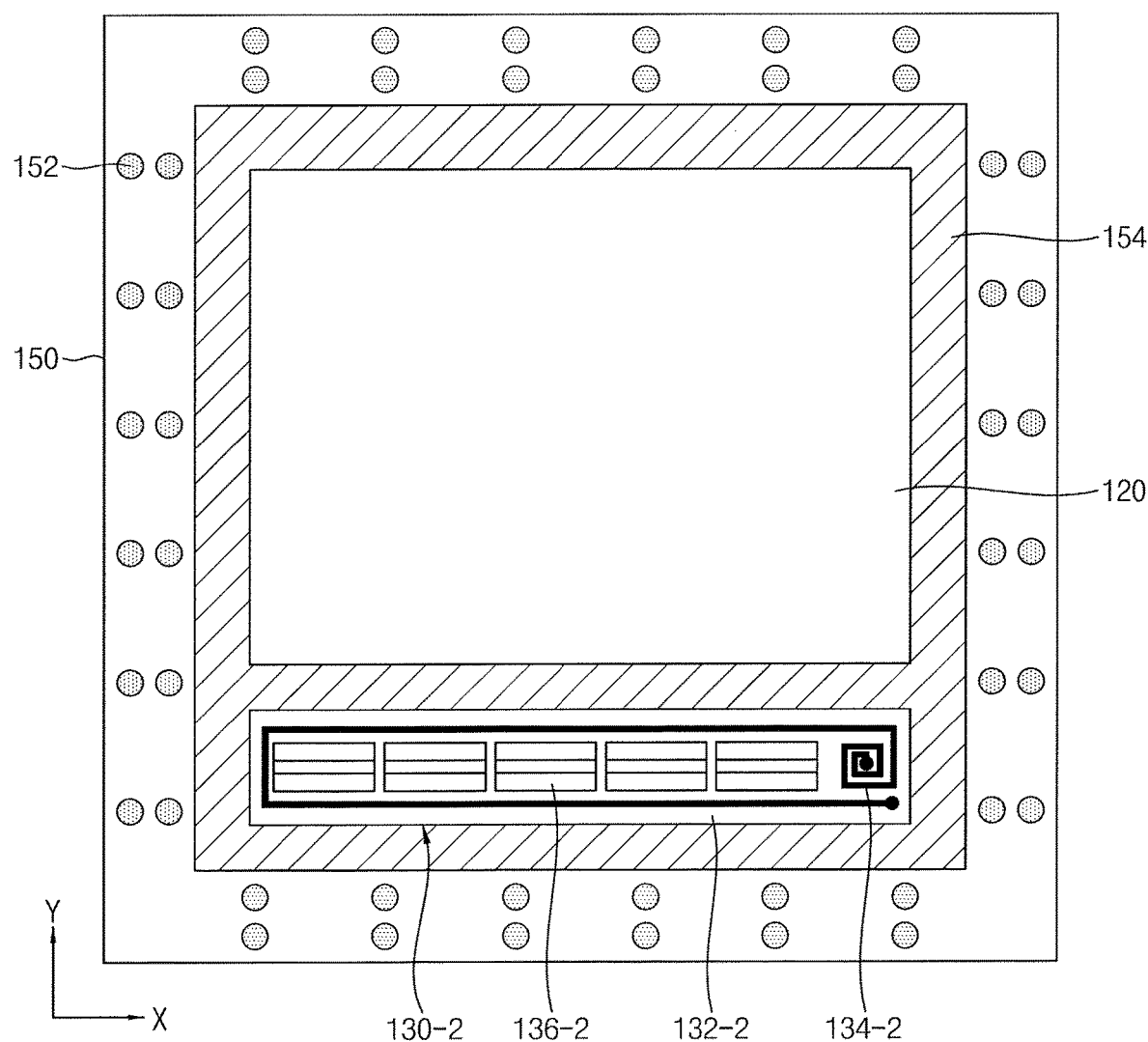
FIG. 5 illustrates an exemplary top view of the application processor, the cache memory chip, and a passive device module.

FIG. 5 illustrates an exemplary top view of the application processor 110, the cache memory chip 120, and a passive device module 130-2.

Referring to FIGS. 2A and 5, the cache memory chip 120 and the passive device module 130-2 may be on the application processor 110. The cache memory chip 120 and the passive device module 130-2 may be adjacent to each other in the horizontal direction (Y-direction) on the top surface of the application processor 110.

The passive device module 130-2 may be on a portion of the top surface of the application processor 110. The passive device module 130-2 may be in the vicinity of the cache memory chip 120. The passive device module 130-2 may include a module substrate 132-2, at least one inductor 134-2, and a plurality of capacitors 136-2.

The module substrate 132-2 of the passive device module 130-2 may be adjacent to (e.g., may extend lengthwise along) one (e.g., only one) of the four edges of the top surface of the application processor 110. In an implementation, the module substrate 132-2 may be adjacent to the lower edge of the application processor 110 (e.g., as oriented in FIG. 5). In a top view, the passive device module 130-2 may have a horizontal bar shape.

The capacitors 136-2 of the passive device module 130-2 may be disposed side-by-side to each other in or along the X-direction. The capacitors 136-2 may be disposed parallel to the one side of the cache memory chip 120 in a plan view.

Figure 6:
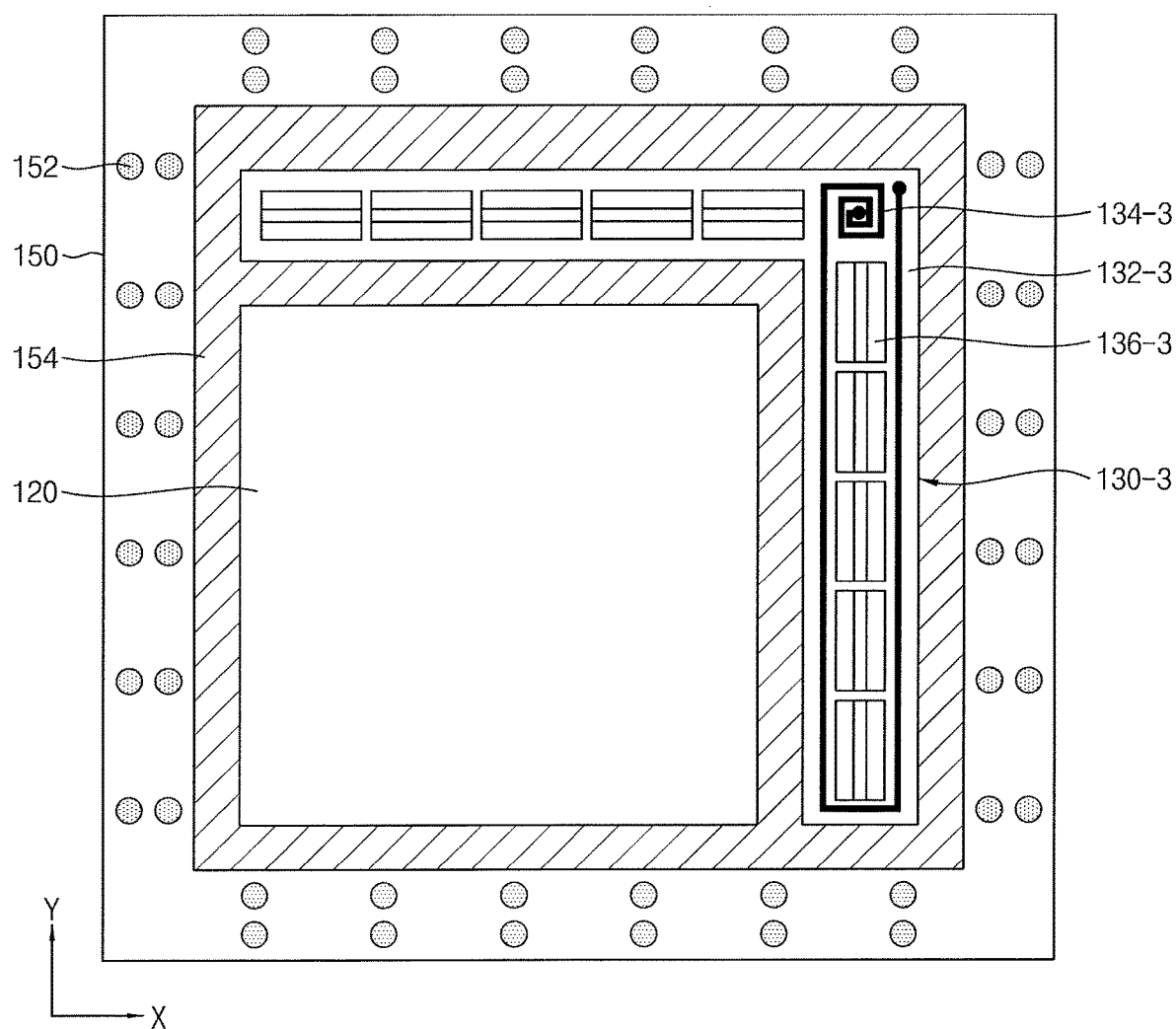
FIGS. 6 to 8 illustrate exemplary top views of the application processor, the cache memory chip, and a passive device module.

FIG. 6 illustrates an exemplary top view of the application processor 110, the cache memory chip 120, and a passive device module 130-3.

Referring to FIGS. 2A and 6, the cache memory chip 120 and the passive device module 130-3 may be on the application processor 110. The cache memory chip 120 and the passive device module 130-3 may be adjacent to each other in the horizontal direction (e.g., X-direction or Y-direction) on the top surface of the application processor 110.

The passive device module 130-3 may include a module substrate 132-3, at least one inductor 134-3, and a plurality of capacitors 136-3. The passive device module 130-3 may be adjacent to (e.g., may extend lengthwise along) at least two of the four edges of the application processor 110. In an implementation, the module substrate 132-3 may be adjacent to the upper and right edges of top surface the application processor 110 (e.g., as oriented in FIG. 6). In a top view, the passive device module 130-3 may have an elbow or L shape.

Figure 7:
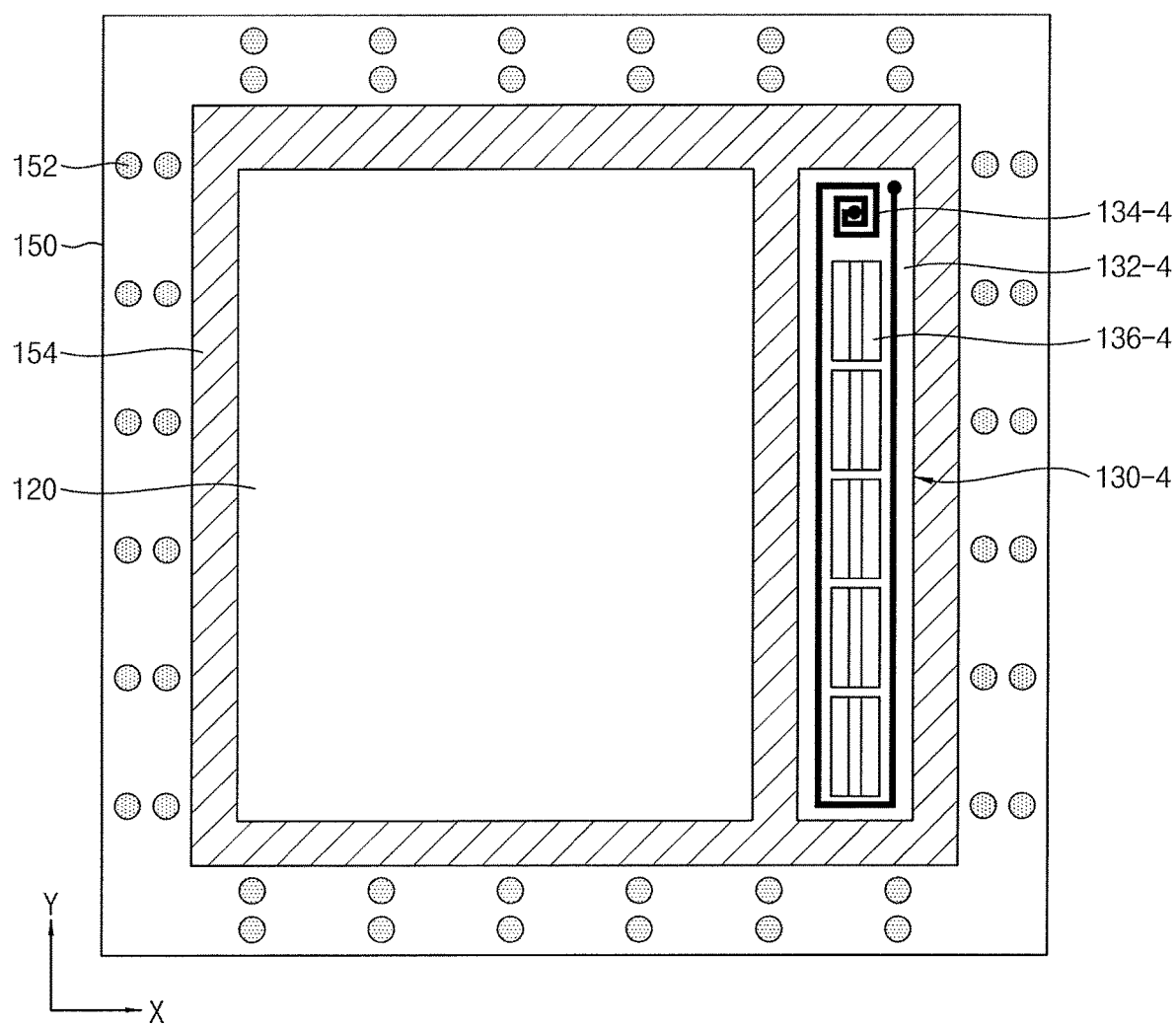

FIG. 7 illustrates an exemplary top view of the application processor 110, the cache memory chip 120, and a passive device module 130-4.

Referring to FIGS. 2A and 7, the cache memory chip 120 and the passive device module 130-4 may be on the application processor 110. The cache memory chip 120 and the passive device module 130-4 may be adjacent to each other in the horizontal direction (e.g., X-direction) on the application processor 110.

The passive device module 130-4 may be on a portion of the top surface of the application processor 110. The passive device module 130-4 may be in the vicinity of the cache memory chip 120.

The passive device module 130-4 may include a module substrate 132-4, at least one inductor 134-4, and a plurality of capacitors 136-4. The module substrate 132-4 of the passive device module 130-4 may be adjacent to (e.g., may extend lengthwise along) one (e.g., only one) of the four edges of the top surface of the application processor 110. In an implementation, the module substrate 132-4 may be disposed to the right edge of the top surface of the application processor 110 (e.g., as oriented in FIG. 7). In a top view, the passive device module 130-4 may have a vertical bar shape.

Figure 8:
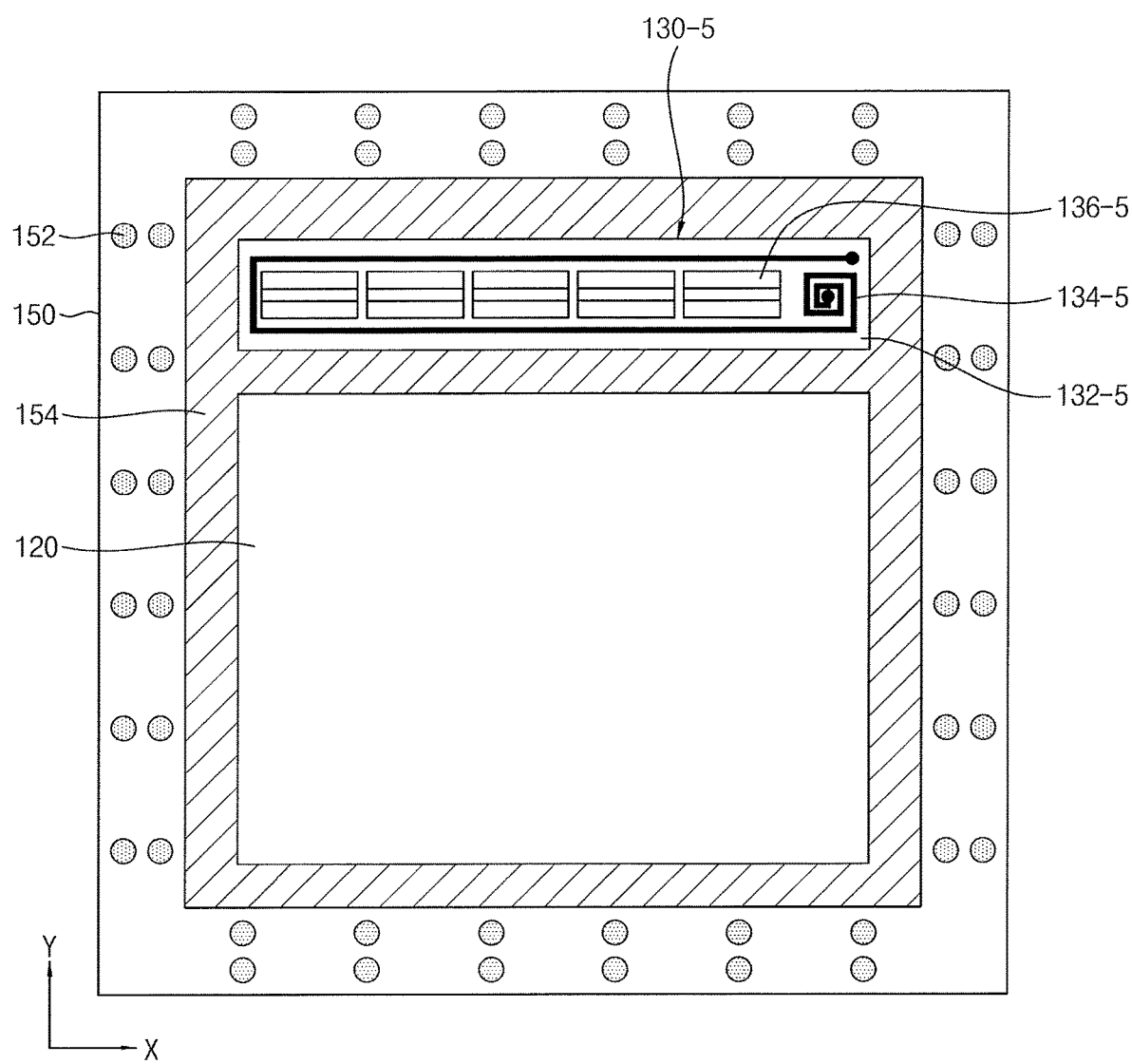

FIG. 8 illustrates an exemplary top view of the application processor 110, the cache memory chip 120, and a passive device module 130-5.

Referring to FIGS. 2A and 8, the cache memory chip 120 and the passive device module 130-5 may be on the application processor 110. The cache memory chip 120 and the passive device module 130-5 may be adjacent to each other in the horizontal direction (e.g., Y-direction) on the application processor 110.

The passive device module 130-5 may be on a portion of the top surface of the application processor 110. The passive device module 130-5 may be in the vicinity of the cache memory chip 120.

The passive device module 130-5 may include a module substrate 132-5, at least one inductor 134-5, and a plurality of capacitors 136-5. The module substrate 132-5 of the passive device module 130-5 may be adjacent to (e.g., may extend lengthwise along) one (e.g., only one) of the four edges of the top surface of the application processor 110. In an implementation, the module substrate 132-5 may be adjacent to the upper edge of the top surface of the application processor 110 (e.g., as oriented in FIG. 8). In a top view, the passive device module 130-5 may have a horizontal bar shape.

Figure 9:
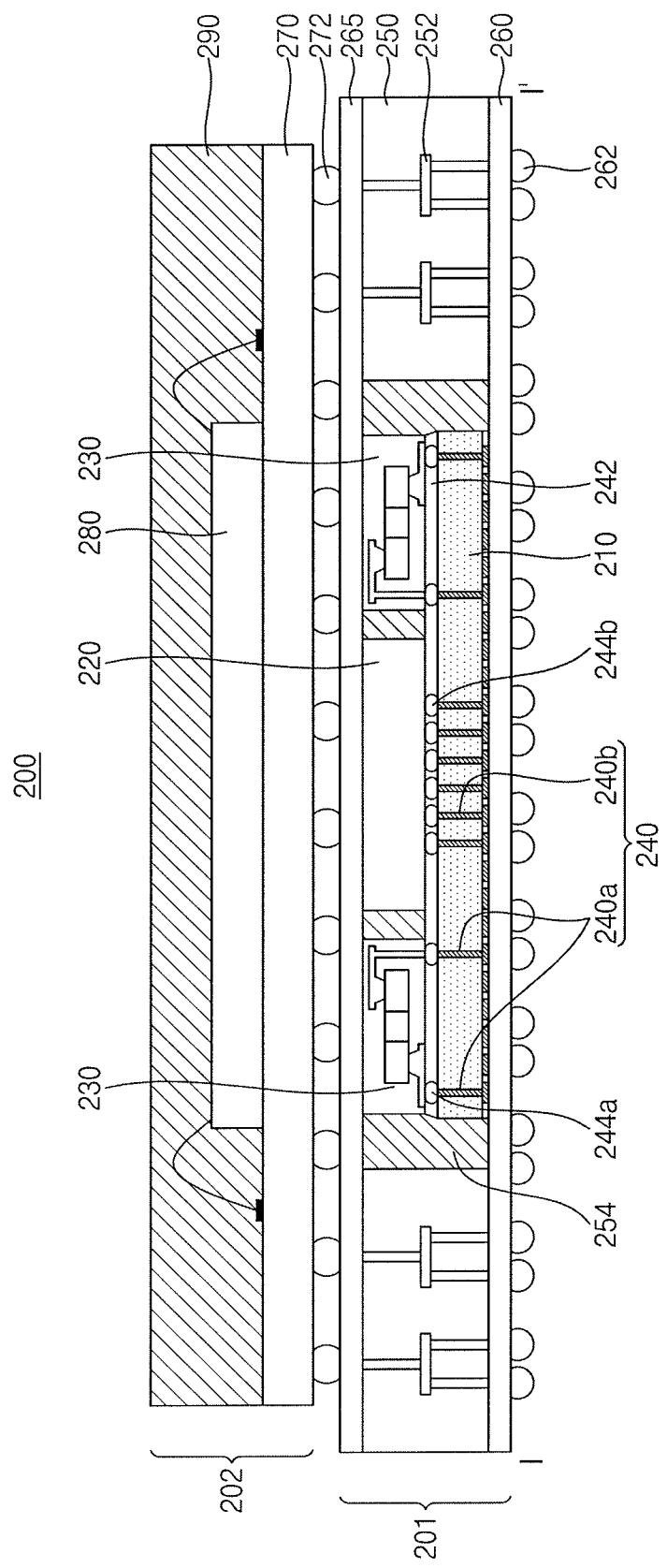
FIG. 9 illustrates a cross-sectional view of a semiconductor package according to an embodiment of the present disclosure.
Figure 10:
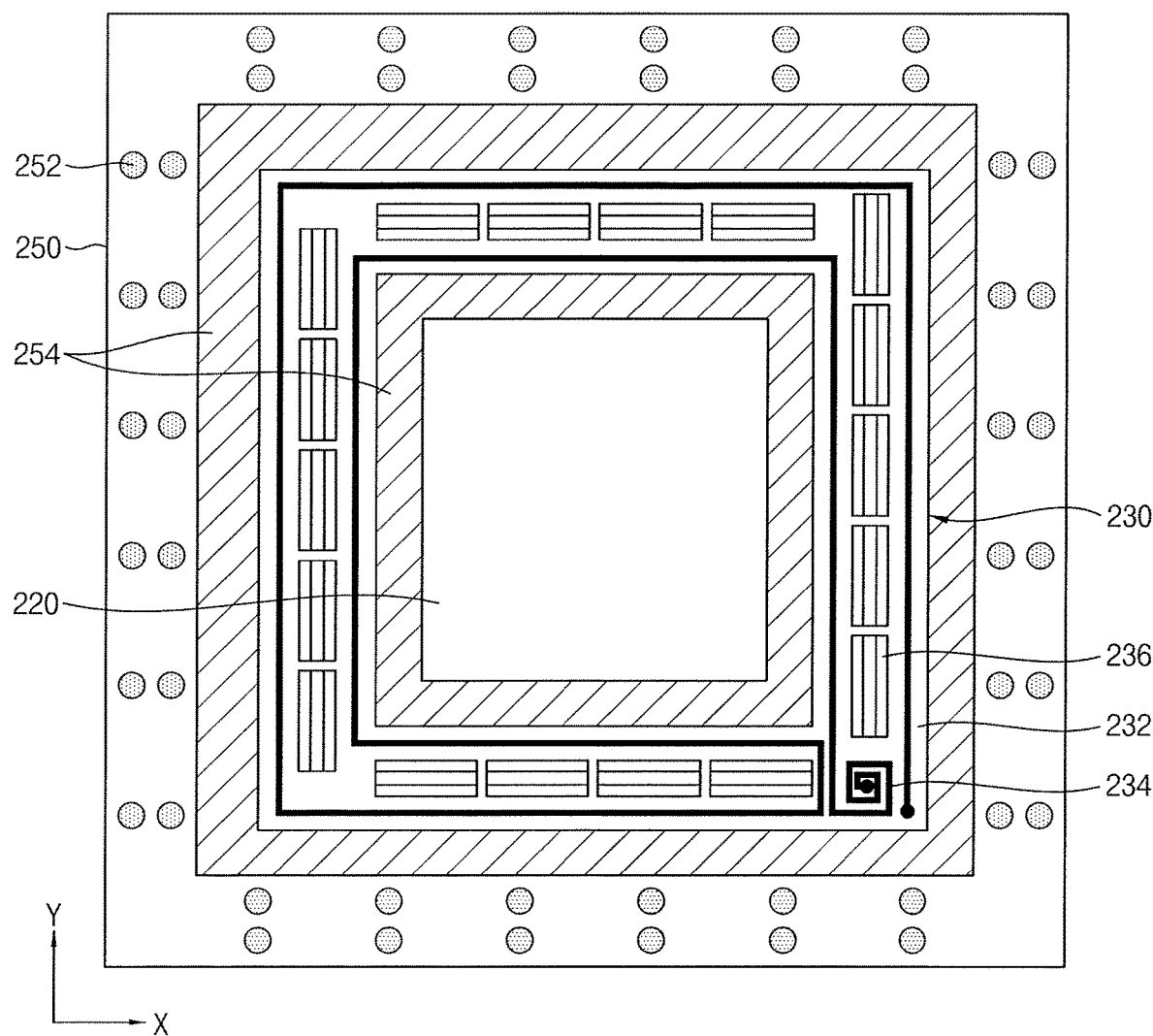
FIG. 10 illustrates an exemplary top view of an application processor, a cache memory chip, and a passive device module.

FIG. 9 illustrates a cross-sectional view of a semiconductor package 200 according to an embodiment of the present disclosure. FIG. 10 illustrates an exemplary top view of an application processor 210, a cache memory chip 220, and a passive device module 230. In the following description of the semiconductor package 200 shown in FIGS. 9 and 10, a repeated explanation of the same components as those of the semiconductor package 100 shown in FIGS. 1 to 3 may be omitted.

Referring to FIGS. 9 and 10, the semiconductor package 200 according to an embodiment of the present disclosure may include a lower package 201 and an upper package 202 stacked on the lower package 201.

The upper package 202 may include an upper substrate 270, a plurality of upper bumps 272, a main memory chip 280, and an upper encapsulation layer 290. The lower package 201 may include an application processor 210, a cache memory chip 220, a passive device module 230, a plurality of through-silicon vias 240, an adhesive layer 242, a plurality of micro-bumps 244a and 244b, a lower substrate 250, a plurality of via connectors 252, a lower encapsulation layer 254, a lower redistribution layer 260, a lower bumps 262, and an upper redistribution layer 265.

The upper bumps 272 may be under the upper substrate 270. The upper bumps 272 may be electrically connected to the upper redistribution layer 265. The upper redistribution layer 265 may include an interposer substrate. The upper redistribution layer 265 may include a plurality of wiring patterns. The upper bumps 272 and the via connectors 252 of the lower substrate 250 may be electrically connected to each other through wiring patterns in the upper redistribution layer 265.

The application processor 210 may be on the central portion of the lower redistribution layer 260. The cache memory chip 220 and the passive device module 230 may be on the application processor 210. The cache memory chip 220 and the passive device module 230 may be adjacent to each other in the horizontal direction (e.g., X-direction or Y-direction) on the top surface of the application processor 210.

The passive device module 230 may be adjacent to the four (e.g., all four) edges of the application processor 210. For example, the passive device module 230 may be adjacent to the left edge, the lower edge, the right edge, and the upper edge of the top surface of the application processor 210 (e.g., as oriented in FIG. 10).

The passive device module 230 may be in the vicinity of the cache memory chip 220. In an implementation, the passive device module 230 may surround the cache memory chip 220.

The lower encapsulation layer 254 may surround the application processor 210, the cache memory chip 220, and the passive device module 230. The lower encapsulation layer 254 may be between the cache memory chip 220 and the passive device module 230. The lower encapsulation layer 254 may be between the passive device module 230 and the lower substrate 250. The lower encapsulation layer 254 may be between the application processor 210 and the lower substrate 250. The lower encapsulation layer 254 may surround or cover the side surfaces of the passive device module 230, the cache memory chip 220, and the application processor 210. The top surface of the lower encapsulation layer 254 and the top surface of the lower substrate 250 may be coplanar. The top surface of the lower encapsulation layer 254 and the top surface of the cache memory chip 220 may be coplanar.

A plurality of through-silicon vias 240 may penetrate the application processor 210. The through-silicon vias 240 may include first through-silicon vias 240a and second through-silicon vias 240b. The first through-silicon vias 240a may electrically connect the application processor 210 and the passive device module 230 to each other. The second through-silicon vias 240b may electrically connect the cache memory chip 220 and the application processor 210 to each other.

A plurality of wiring patterns may be formed in the lower redistribution layer 260. The wiring patterns of the lower redistribution layer 260 and the first through-silicon vias 240a may be electrically connected to each other. The application processor 210 and the passive device module 230 may be connected to each other through the wiring patterns of the lower redistribution layer 260 and the first through-silicon vias 240a. In an implementation, the wiring patterns of the lower redistribution layer 260 and the second through-silicon vias 240b may be electrically connected to each other. The application processor 210 and the cache memory chip 220 may be connected to each other through the wiring patterns of the lower redistribution layer 260 and the second through-silicon vias 240b.

The passive device module 230 may include a module substrate 232, at least one inductor 234, and a plurality of capacitors 236.

The inductor 234 and the first micro-bumps 244a may be in contact with each other, and the first micro-bumps 244a and the first through-silicon vias 240a may be in contact with each other. The first through-silicon vias 240a and the wiring patterns of the lower redistribution layer 260 may be in contact with each other. The cache memory chip 220 and the second micro-bumps 244b may be in contact with each other, and the second micro-bumps 244b and the second through-silicon vias 240b may be in contact with each other. The second through-silicon vias 240b and the wiring patterns of the lower redistribution layer 260 may be in contact with each other.

The module substrate 232 of the passive device module 230 may be adjacent to the four edges of the top surface of the application processor 210. In a top view, the passive device module 230 may have a frame shape.

The inductor 234 of the passive device module 230 may be formed in a conductive wiring pattern, and may have a predetermined length on the top surface of the module substrate 232. The inductor 234 may surround the capacitors 236. In an implementation, the inductor 234 and sides of the capacitors 236 may be side-by-side.

The inductor 234 and the first through-silicon vias 240a may be in contact with each other at a position adjacent to at least one of the four corners of the application processor 210. For example, the contact position between the inductor 234 and the first through-silicon vias 240a may be adjacent to the lower-right corner of the application processor 210 (e.g., as oriented in FIG. 10). In an implementation, the contact position between the inductor 234 and the first through-silicon vias 240a may be adjacent to the upper-right corner of the application processor 210. In an implementation, the contact position between the inductor 234 and the first through-silicon vias 240a may be adjacent to the lower-left corner of the application processor 210. In an implementation, the contact position between the inductor 234 and the first through-silicon vias 240a may be adjacent to the upper-left corner of the application processor 210.

The cache memory chip 220 and the second through-silicon vias 240b may be in contact with each other at a position corresponding to the central portion of the application processor 210. The second through-silicon vias 240b and the wiring patterns of the lower redistribution layer 260 may be in contact with each other, and the application processor 210 and the cache memory chip 220 may be electrically connected to each other.

In an implementation, the passive device module 230 may include one inductor 234 shown in FIG. 10. In an implementation, the passive device module 230 may include a plurality of inductors 234.

Figure 11:
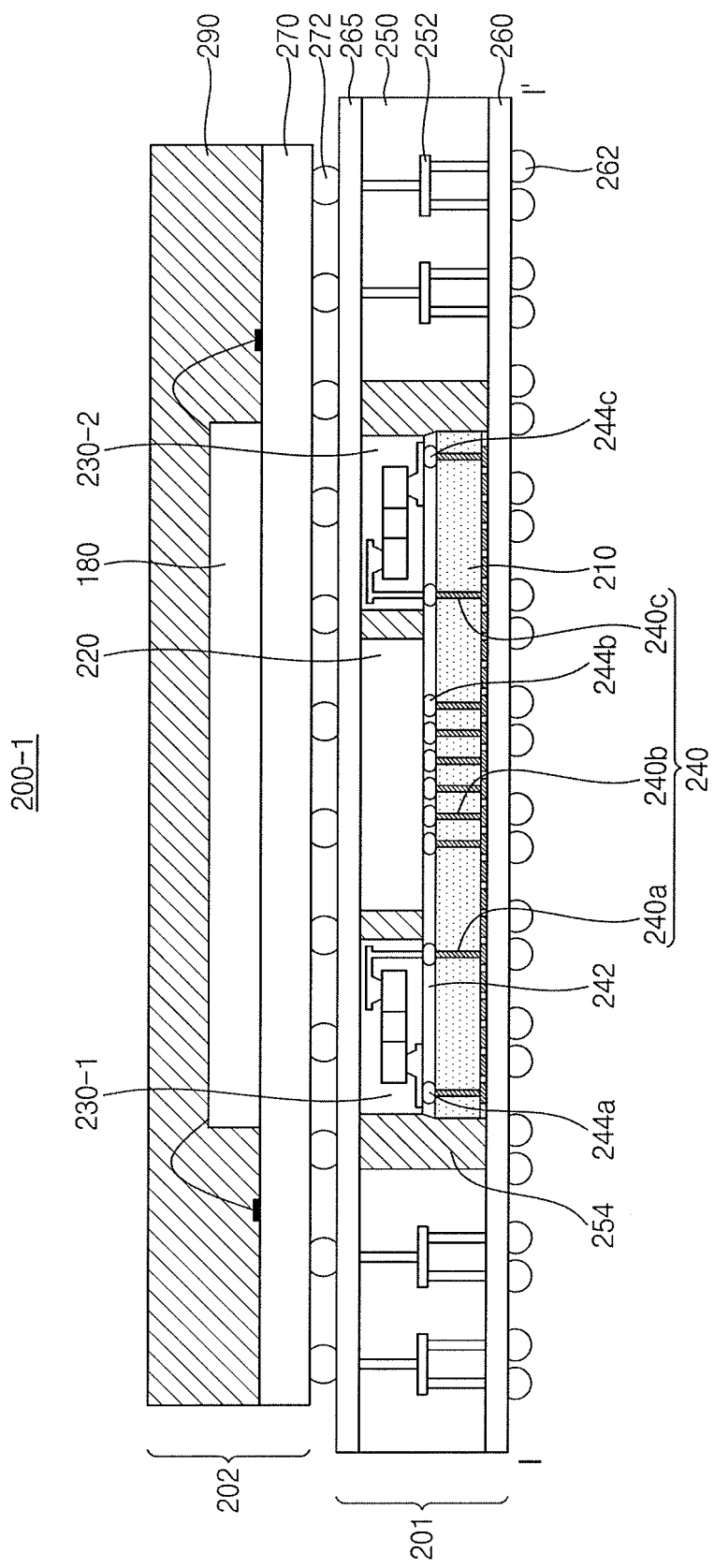
FIG. 11 illustrates a cross-sectional view of a semiconductor package according to an embodiment of the present disclosure.
Figure 12:
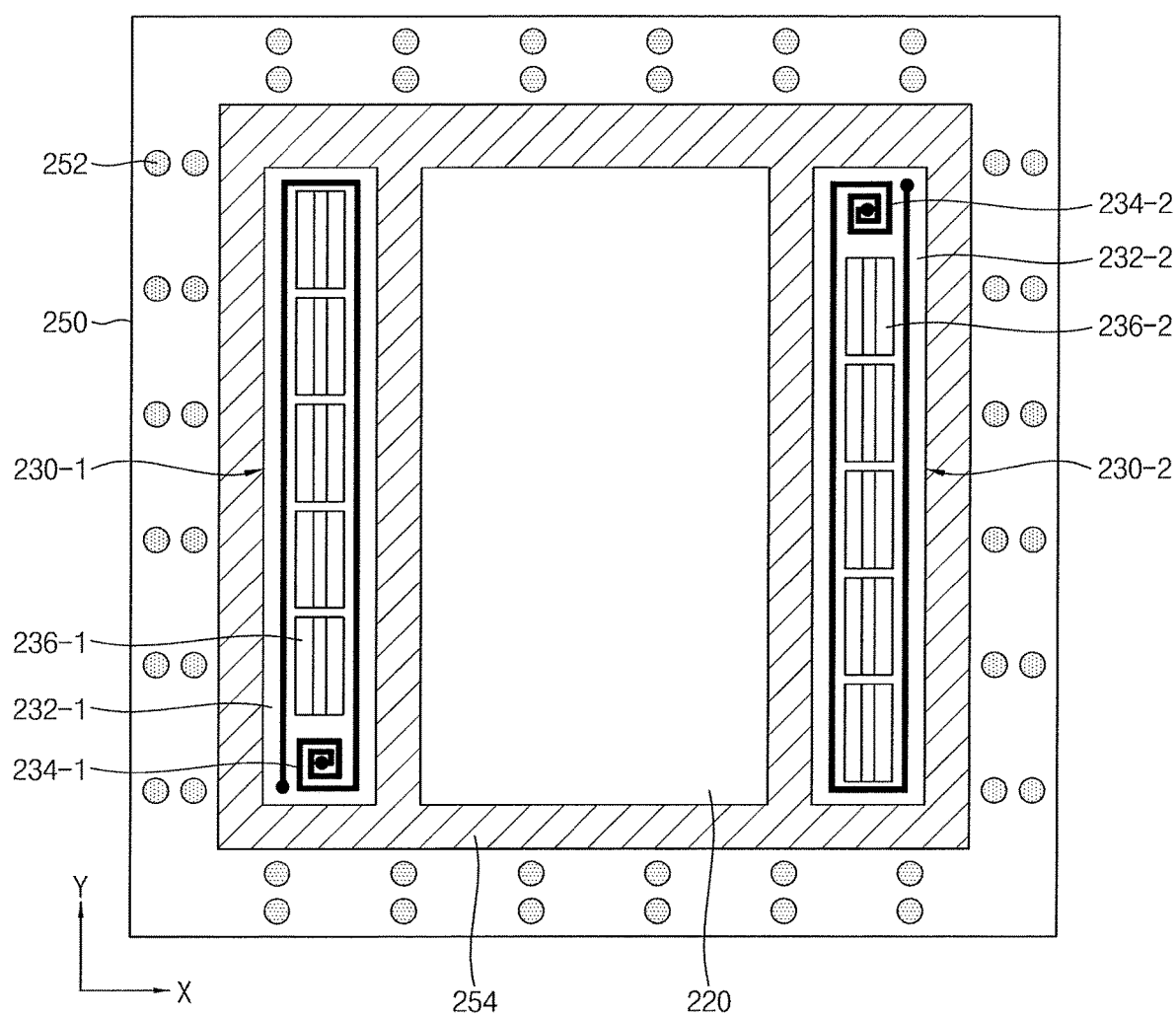
FIGS. 12 and 13 illustrate views of examples in which passive device modules are on an application processor.

FIG. 11 illustrates a cross-sectional view of a semiconductor package according to an embodiment of the present disclosure. FIG. 12 illustrates a view of an example in which passive device modules 230-1 and 230-2 are on an application processor 210. In the following description of the semiconductor package 200-1 shown in FIGS. 11 and 12, a repeated explanation of the same components as those of the semiconductor package 100 shown in FIGS. 1 to 3 may be omitted.

Referring to FIGS. 11 and 12, the semiconductor package 200-1 according to an embodiment of the present disclosure may include a lower package 201 and an upper package 202 stacked on the lower package 201.

The upper package 202 may include an upper substrate 270, a plurality of upper bumps 272, a main memory chip 280, and an upper encapsulation layer 290. The lower package 201 may include an application processor 210, a cache memory chip 220, a plurality of passive device modules 230-1 and 230-2, a plurality of through-silicon vias 240, a plurality of micro-bumps 244a, 244b and 244c, an adhesive layer 242, a lower substrate 250, a plurality of via connectors 252, a lower encapsulation layer 254, a lower redistribution layer 260, a lower bumps 262, and an upper redistribution layer 265.

The passive device modules 230-1 and 230-2 may include a first passive device module 230-1 and a second passive device module 230-2. The first passive device module 230-1 and the second passive device module 230-2 may be in the vicinity of the cache memory chip 220. The first passive device module 230-1 may be in a first region of the top surface of the application processor 210. For example, the first passive device module 230-1 may be adjacent to (e.g., may extend lengthwise along) the left edge of the application processor 210 (e.g., as oriented in FIG. 12). The second passive device module 230-2 may be in a second region of the top surface of the application processor 210. The second passive device module 230-2 may be adjacent to (e.g., may extend lengthwise along) the right peripheral portion of the application processor 210 (e.g., as oriented in FIG. 12).

In an implementation, on the application processor 210, the first passive device module 230-1 may be adjacent to a first side of the cache memory chip 220. For example, the first passive device module 230-1 may be adjacent to the left side of the cache memory chip 220. In an implementation, on the application processor 210, the second passive device module 230-2 may be adjacent to a second side of the cache memory chip 220 (e.g., a side opposite to the first side in the X-direction). For example, the second passive device module 230-2 may be adjacent to the right side of the cache memory chip 220. The first passive device module 230-1 and the second passive device module 230-2 may each have a vertical bar shape, respectively.

The first inductor 234-1 of the first passive device module 230-1 may surround the first capacitors 236-1. The second inductor 234-2 of the second passive device module 230-2 may surround the second capacitors 236-2.

The first inductor 234-1 of the first passive device module 230-1 and the first micro-bumps 244a may be in contact with each other, and the first micro-bumps 244a and the first through-silicon vias 240a may be in contact with each other. The first through-silicon vias 240a and the wiring patterns of the lower redistribution layer 260 may be in contact with each other. The cache memory 220 and the second micro-bumps may be in contact with each other, and the second micro-bumps and the second through-silicon vias 240b may be in contact with each other. The second through-silicon vias 240b and the wiring patterns of the lower redistribution layer 260 may be in contact with each other. The second inductor 234-2 of the second passive device module 230-2 and the third micro-bumps 244c may be in contact with each other, and the third micro-bumps 244c and the third through-silicon vias 340c may be in contact with each other. The third through-silicon vias 240c and the wiring patterns of the lower redistribution layer 260 may be in contact with each other.

The first passive device module 230-1 may include a first module substrate 232-1, at least one first inductor 234-1, and a plurality of first capacitors 236-1. The second passive device module 230-2 may include a second module substrate 232-2, at least one second inductor 234-2, and a plurality of second capacitors 236-2. The lower encapsulation layer 254 may surround of cover the side surfaces of the first passive device module 230-1, the second passive device module 230-2, the cache memory chip 220, and the application processor 210.

A plurality of through-silicon vias 240 may penetrate the application processor 210. Among the through-silicon vias 240, first through-silicon vias 240a may electrically connect the application processor 210 to the first passive device module 230-1. Among the through-silicon vias 240, second through-silicon vias 240b may electrically connect the cache memory chip 220 to the application processor 210. Among the through-silicon vias 240, third through-silicon vias 240c may electrically connect the second passive device module 230-2 t0 the application processor 210.

In an implementation, as illustrated in FIG. 12, the first passive device module 230-1 may include one first inductor 234-1. In an implementation, the first passive device module 230-1 may include a plurality of first inductors 234-1. In an implementation, the second passive device module 230-2 may include a plurality of second inductors 234-2.

Figure 13:
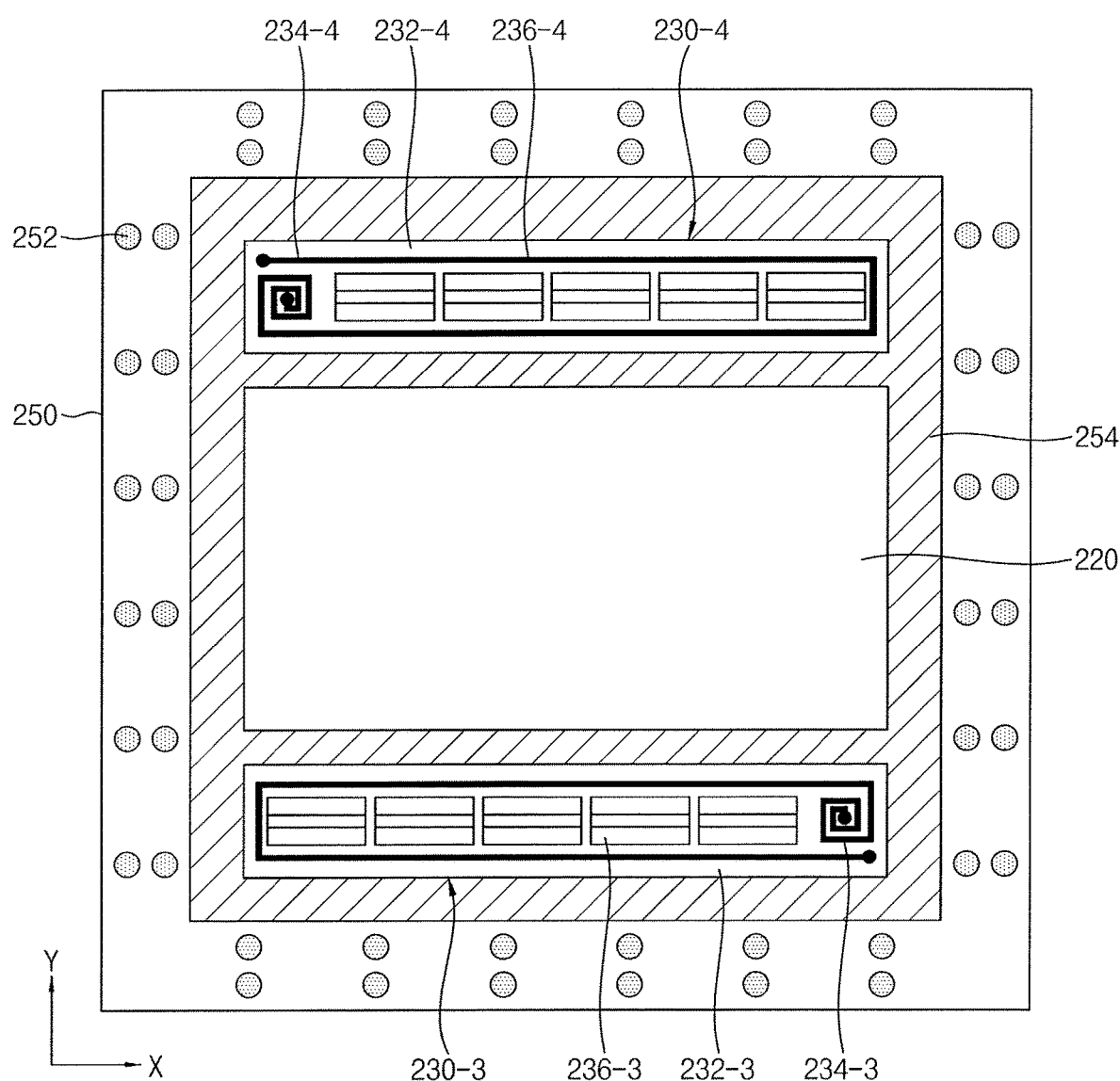

FIG. 13 illustrates a view of an example in which passive device modules 230-3 and 230-4 are on an application processor 210.

Referring to FIGS. 11 and 13, a cache memory chip 220 and a plurality of passive device modules 230-3 and 230-4 may be on the application processor 210. The cache memory chip 220 and the first passive device module 230-3 may be adjacent to each other in the horizontal direction (e.g., Y-direction) on the top surface of the application processor 210. In an implementation, the cache memory chip 220 and the second passive device module 230-4 may be adjacent to each other (e.g., in the Y-direction).

For example, the first passive device module 230-3 may be adjacent to the lower edge of the application processor 210 (e.g., as oriented in FIG. 13). The second passive device module 230-4 may be adjacent the upper edge of the application processor 210 (e.g., as oriented in FIG. 13). The first passive device module 230-3 and the second passive device module 230-4 may be adjacent to a lower side and an upper side of the cache memory chip 220 (e.g., such that the cache memory chip 220 may be between the first passive device module 230-3 and the second passive device module 230-4 in the Y-direction).

The first passive device module 230-3 may include a first module substrate 232-3, at least one first inductor 234-3, and a plurality of first capacitors 236-3.

The second passive device module 230-4 may include a second module substrate 232-4, at least one second inductor 234-4, and a plurality of second capacitors 236-4.

The first module substrate 232-3 of the first passive device module 230-3 may be adjacent to the lower edge of the application processor 210 (e.g., as oriented in FIG. 13). In a top view, the first passive device module 230-3 may have a horizontal bar shape.

The second module substrate 232-4 of the second passive device module 230-4 may be disposed adjacent to the upper edge of the application processor 210 (e.g., as oriented in FIG. 13). In a top view, the second passive device module 230-4 may have a horizontal bar shape.

The first inductor 234-3 of the first passive device module 230-3 may surround the first capacitors 236-3. The second inductor 234-4 of the second passive device module 230-4 may surround the second capacitors 236-4.

By way of summation and review, in a semiconductor device, passive devices may be in the vicinity of the bottom lower bumps, and an area of the semiconductor package may be increased in order to secure a sufficient number of in/out terminals. There may be a limitation on the extent to which the area of the semiconductor package may be increased, and it may be difficult to secure a suitable number of passive devices.

One or more embodiments may provide a fan-out panel level packaging (FO-PLP)-type semiconductor package having a reduced thickness.

One or more embodiments may provide a fan-out panel level packaging (FO-PLP)-type semiconductor package in which a sufficient number of passive devices is secured.

One or more embodiments may provide a fan-out panel level packaging (FO-PLP)-type semiconductor package in which a sufficient number of in/out terminals is secured.

One or more embodiments may provide a semiconductor package having improved electrical characteristics by connecting a passive device module and an application processor, which are embedded in the package, to each other through a through-silicon via (TSV) and a redistribution layer (RDL).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a lower redistribution layer including wiring patterns;
   a lower substrate on the lower redistribution layer, the lower substrate including a cavity;
   an application processor on the lower redistribution layer in the cavity;
   a cache memory chip on the application processor;
   a passive device module on the application processor;
   a plurality of first through-silicon vias penetrating the application processor to connect the lower redistribution layer to the passive device module; and
   lower bumps on a bottom surface of the lower redistribution layer,
   wherein:
   the passive device module is adjacent to a side of the cache memory chip,
   the passive device module includes:
     a module substrate;
     at least one inductor on the module substrate; and
     a plurality of capacitors,
   the plurality of capacitors includes first capacitors disposed side-by-side in a first direction, and
   the at least one inductor surrounds the first capacitors.

2. The semiconductor package as claimed in claim 1, wherein the plurality of capacitors further includes second capacitors disposed side-by-side in a second direction perpendicular to the first direction.

3. The semiconductor package as claimed in claim 2, wherein the at least one inductor surrounds the second capacitors in a top view.

4. The semiconductor package as claimed in claim 2, wherein the at least one inductor is at an intersection between the first capacitors disposed side-by-side in the first direction and the second capacitors disposed side-by-side in the second direction.

5. The semiconductor package as claimed in claim 1, further comprising a plurality of second through-silicon vias penetrating the application processor to connect the cache memory chip to the application processor.

6. The semiconductor package as claimed in claim 5, further comprising a lower encapsulation layer, wherein the lower encapsulation layer:
   is between the cache memory chip and the passive device module in the cavity, and
   covers side surfaces of the passive device module, the cache memory chip, and the application processor.

7. The semiconductor package as claimed in claim 6, wherein a top surface of the lower encapsulation layer and top surfaces of the lower substrate and the cache memory chip are coplanar.

8. The semiconductor package as claimed in claim 1, further comprising:
   an upper redistribution layer on the passive device module; and
   a plurality of via connectors in the lower substrate,
   wherein the via connectors electrically connect the upper redistribution layer to the lower redistribution layer.

9. A semiconductor package, comprising:
   a lower redistribution layer including a plurality of wiring patterns;
   a lower substrate on the lower redistribution layer, the lower substrate including a cavity;
   an application processor on the lower redistribution layer in the cavity;
   a cache memory chip on the application processor;
   a first passive device module on a top surface of the application processor and adjacent to a first edge of the application processor;
   a plurality of first through-silicon vias penetrating the application processor and electrically connecting the application processor to the first passive device module;
   a plurality of second through-silicon vias penetrating the application processor and electrically connecting the application processor to the cache memory chip; and
   lower bumps on a bottom surface of the lower redistribution layer,
   wherein:
   the first passive device module is adjacent to a first side of the cache memory chip,
   the first passive device module includes:
      a first module substrate;
      at least one first inductor on the first module substrate; and
      a plurality of first capacitors, and
   the at least one first inductor surrounds the plurality of first capacitors.

10. The semiconductor package as claimed in claim 9, wherein the plurality of first capacitors is disposed parallel to the first side of the cache memory chip in a top view.

11. The semiconductor package as claimed in claim 9, further comprising a second passive device module on the top surface of the application processor and adjacent to a second edge of the application processor.

12. The semiconductor package as claimed in claim 11, wherein:
   the second passive device module includes:
      a second module substrate;
      at least one second inductor on the second module substrate; and
      a plurality of second capacitors, and
   the at least one second inductor surrounds the plurality of second capacitors in a top view.

13. A semiconductor package, comprising:
   a lower package;
   an upper package stacked on the lower package; and
   a plurality of upper bumps configured to connect the lower package to the upper package,
   wherein the lower package includes:
   a lower redistribution layer including a plurality of wiring patterns;
   a lower substrate including a cavity;
   an application processor on the lower redistribution layer in the cavity;
   a cache memory chip on the application processor;
   a passive device module in a first region of a top surface of the application processor; and
   lower bumps on a bottom surface of the lower redistribution layer, and
   wherein:
   the passive device module is adjacent and parallel to at least one side surface of the cache memory chip,
   the passive device module includes:
      a module substrate;
      at least one inductor on the module substrate; and
      a plurality of capacitors, and
   the at least one inductor surrounds the plurality of capacitors.

14. The semiconductor package as claimed in claim 6, wherein:
   the passive device module is adjacent to at least two side surfaces of the cache memory chip, and
   the plurality of capacitors is disposed parallel to the at least two side surfaces of the cache memory chip.

15. The semiconductor package as claimed in claim 1, wherein the at least one inductor continuously extends in the first direction along sides of the first capacitors.

16. The semiconductor package as claimed in claim 9, wherein the at least one first inductor continuously extends along sides of the plurality of first capacitors.

17. The semiconductor package as claimed in claim 13, wherein the at least one inductor continuously extends along sides of the plurality of capacitors.

* * * * *